United States Patent [19]

Perszyk

[11] 3,902,128

[45] Aug. 26, 1975

[54] FREQUENCY/PHASE COMPARATOR

[75] Inventor: Thomas H. Perszyk, Margate, Fla.

[73] Assignee: Motorola, Inc., Chicago, Ill.

[22] Filed: Aug. 5, 1974

[21] Appl. No.: 492,953

[52] U.S. Cl. ................ 328/134; 307/210; 307/295; 331/1 A

[51] Int. Cl.[2] ........................................... H03B 3/04

[58] Field of Search ..... 328/134; 331/1 A; 307/210, 307/232, 233, 295, 271

[56] References Cited

UNITED STATES PATENTS 3,813,610 5/1974 Kimura .............................. 331/1 A 3,815,042 6/1974 Maunsell............................ 331/1 A

*Primary Examiner*—John Kominski

*Attorney, Agent, or Firm*—James W. Gillman; Eugene A. Parsons

[57] ABSTRACT

Logic circuitry receiving reference pulses and variable frequency pulses (from a source such as a voltage controlled oscillator) and providing pulses at three outputs connected to the control terminals of three gating circuits. The first gating circuit connects a capacitor to a current source and the pulses applied to the gate are proportional to the amount of time by which the reference pulse leads the variable frequency pulse. Thus, the charge on the capacitor is proportional to the difference in phase between the pulses, within a given phase range, and is maximum or zero beyond the phase comparison range, to provide frequency comparison. The second gate operates after the first gate has charged the capacitor to the desired amount and provides a sample of the capacitor voltage at an output. The third gate operates after the sample has been taken to discharge the capacitor for the next cycle. Logic circuitry adjusts the phase of the reference pulses to place the pulses at the correct time to coincide with the time at which the correct variable frequency pulses should occur. Thus, the circuit cannot lock onto harmonics of the variable frequency pulses.

8 Claims, 2 Drawing Figures

FREQUENCY/PHASE COMPARATOR

BACKGROUND OF THE INVENTION

1. Field of the Invention

The present invention pertains to frequency/phase comparators which are utilized in a great variety of electronic circuits, including phase locked loops and the like. Phase comparators, while extremely accurate, can lock onto harmonics of the desired frequency and, therefore, must include additional safeguards to prevent this. Frequency comparators, while not susceptible to locking onto a harmonic of the desired frequency, cannot provide the accuracy required in most applications. Thus, it is desirable to construct a single circuit which compares the frequency to select the correct signal and then compares the phase of the correct signal to the phase of the reference signal.

2. Description of the Prior Art

In all prior art phase and frequency comparators, or simply phase comparators, an analogue output voltage is supplied, which continuously indicates the phase relationship between the two signals applied to the comparator, or samples of a voltage corresponding to the phase relationship are supplied, which samples are taken as the voltage is being developed. Because the output voltage of the comparator is varying as it is being used or sampled, these prior art circuits tend to produce internal noise and may adversely affect the accuracy of the comparator unless sufficient decoupling is provided.

SUMMARY OF THE INVENTION

The present invention pertains to a frequency/phase comparator including logic circuitry providing pulses at first, second and third outputs connected to the control terminals of first, second and third gating means. The first gating means controls the amount of voltage supplied to voltage storage means, the second gating means samples the voltage in the storage means subsequent to the operation of the first gating means and the third gating means removes the voltage from the storage means subsequent to the sampling thereof. The logic circuitry controls the gates so that the voltage in the storage means is zero when the frequency of the signal being compared to a reference signal is higher than the frequency of the reference signal, beyond the phase comparison mode, and the voltage is maximum when the frequency of the signal being compared is lower than the frequency of the reference signal, beyond the phase comparison mode. The logic circuitry also adjusts the phase of subsequent pulses in the reference signal so that they occur in a predetermined time slot to prevent the comparator from comparing harmonics of the signals.

It is an object of the present invention to provide a new and improved frequency/phase comparator.

It is a further object of the present invention to provide a frequency/phase comparator which produces less internal noise.

It is a further object of the present invention to provide a frequency/phase comparator wherein the phase detector sensitivity is adjustable.

It is a further object of the present invention to provide an improved frequency/phase comparator including additional safeguards so that when the comparator is used in a phase locked loop the loop will not lock on harmonics.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENT

Figure 1:
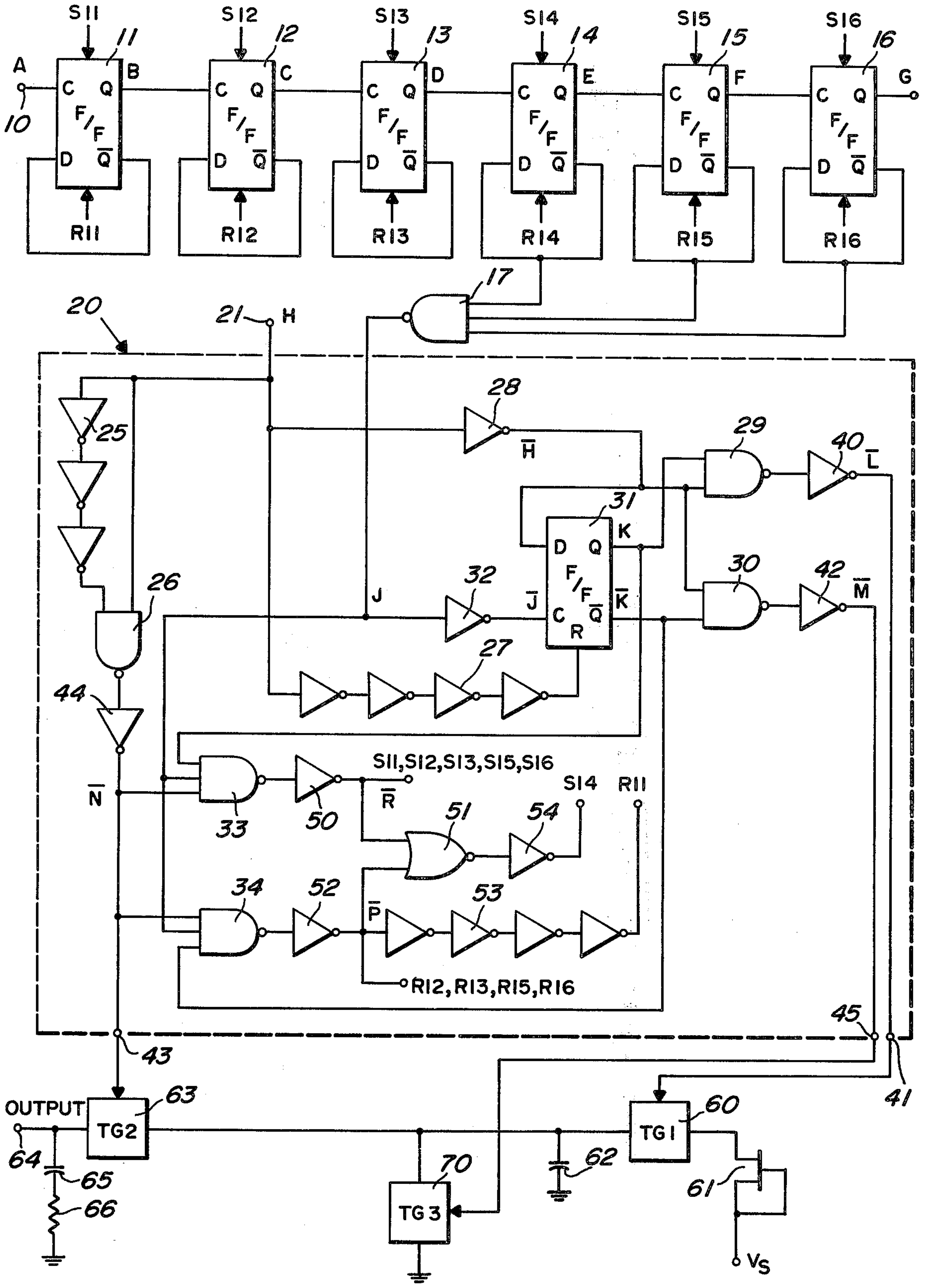
FIG. 1 is a block/schematic diagram of a frequency/phase comparator embodying the present invention.

Referring specifically to FIG. 1, the numeral 10 designates a first input terminal adapted to receive a reference signal, such as for example the output of a reference oscillator or the like. The input terminal 10 is connected to an input of a flip-flop circuit 11. Flip-flop circuits 11 through 16 are connected with the output of the preceding flip-flop applied to the input of the subsequent flip-flop to form a divider circuit which divides the reference signal applied to the terminal 10 by 64. For example, in the present embodiment a 1.6 MHz signal is applied to the input terminal 10 and a 25 KHz signal is available at the output of the flip-flop 16. Each of the flip-flops 11–16 has a set and reset terminal designated S11–S16 and R11–R16. The inverted outputs of the flip-flops 14, 15 and 16 are applied to three inputs of a coincidence or NAND circuit 17 the output of which provides reference pulses for application to logic circuitry, generally designated 20.

A second input terminal 21 is adapted to receive a variable frequency signal, for example, a signal from a voltage controlled oscillator or the like. The center frequency of the variable frequency signal applied to the terminal 21 will generally be approximately the same frequency as the reference pulses available at the output of the coincidence circuit 17. The reference signal applied to the input terminal 10 is illustrated as wave form A in FIG. 2 and the wave forms available at the outputs of the flip-flops 11 through 16 are illustrated as wave forms B through G in FIG. 2. The wave form applied to the logic circuit 20 from the output of the coincidence gate 17 is illustrated as wave form J in FIG. 2. The second signal applied to the logic circuit 20 by way of terminal 21 is illustrated as wave form H in FIG. 2. It should be understood that the wave forms illustrated are simply exemplary and the frequencies, polarities, wave shapes, etc. may vary in accordance with the circuitry utilized and the specific results desired.

Terminal 21 is connected to the input of a series of three inverters 25, an input of a coincidence circuit 26, the input of a series of 4 inverters 27 and the input of an inverter 28. The output of the series of 3 inverters 25 is connected to a second input of the coincidence circuit 26 and supplies a delayed pulse thereto so that the output pulses of the coincidence circuit 26 have a fixed pulse width. The output of the inverter 28 (illustrated as $\overline{H}$ in FIG. 2) is connected to an input of a first coincidence circuit 29, an input of a second coincidence circuit 30 and an input of a flip-flop 31. The output pulses from the coincidence circuit 17 are connected through an inverter circuit 32 to a second input of the flip-flop 31 and are further connected to an input of a coincidence circuit 33 and an input of a coincidence circuit 34. In the present embodiment, each of the coincidence circuits 17, 26, 29, 30, 33 and 34 are illustrated as NAND circuits which may be integrated onto a single semiconductor chip along with the remaining logic circuitry if desired. The output of the series of 4 inverters 27 is applied to the reset terminal of the flip-flop 31 and supplies a delayed reset pulse therefor. The non-inverted output of the flip-flop 31 (wave form K in FIG. 2) is applied to a second input of the coincidence circuit 29 and a second input of the coincidence circuit 33. The inverted output of the flip-flop 31 (wave form $\overline{K}$ in FIG. 2) is applied to a second input of the coincidence circuit 30 and a second input of the coincidence circuit 34. Output pulses from the coincidence circuit 29 are inverted by an inverter 40 and appear at a first output terminal 41 as the wave form $\overline{L}$ illustrated in FIG. 2. Output pulses from the coincidence circuit 26 are inverted by an inverter 44 and appear at a second output terminal 43 as the wave form $\overline{N}$, illustrated in FIG. 2. Output pulses from the coincidence circuit 30 are inverted by an inverter 42 and appear at a third output terminal 45 as wave form $\overline{M}$, illustrated in FIG. 2.

The inverted output pulses from inverter 44 are supplied to a third input of coincidence circuit 33 and a third input of coincidence circuit 34. The output pulses of coincidence circuit 33 are inverted by an inverter 50 and applied to one input of a NOR circuit 51. The inverted pulses from inverter 50 are also supplied to the S11, S12, S13, S15 and S16 inputs of flip-flops 11, 12, 13, 15 and 16. The output pulses of coincidence circuit 34 are inverted by an inverter 52 and applied to a second input of the NOR circuit 51 and to an input of a series of 4 inverters 53. The output pulses of the inverter 52 are also applied to the R12, R13, R15 and R16 terminals of flip-flops 12, 13, 15 and 16. The delayed pulse from the series of 4 inverters 53 is applied to the R11 terminal of flip-flop 11. The output of the NOR circuit 51 is inverted by an inverter 54 and applied to the S14 input of flip-flop 14.

First gating means 60, which in this embodiment is illustrated as a semiconductor transmission gate, has a control terminal connected to the first output terminal 41 of logic circuitry 20. An input terminal of the gating means 60 is connected through the drain-source junction of a field effect transistor 61 to a terminal $V_S$ adapted to have a suitable source of power applied thereto. The gate of the transistor 61 is also connected to the terminal $V_S$ so that the transistor 61 is always conducting and serves as a constant current source. Voltage storage means, which in this embodiment is a capacitor 62, is connected between an output terminal of the gating means 60 and a reference potential, in this embodiment ground. Second gating means 63 has a control terminal connected to the second output terminal 43 of logic circuitry 20, an input terminal connected to the junction of capacitor 62 and the output terminal of the gating means 60, and an output terminal connected to an output terminal 64 of the comparator circuit and through a series connected capacitor 65 and resistor 66 to the reference point (ground). Third gating means 70 has a control terminal connected to the third output terminal 45 of logic circuitry 20, an input terminal connected to the junction of capacitor 62 and the output terminal of gating means 60, and an output terminal connected to the reference point (ground).

Figure 2:
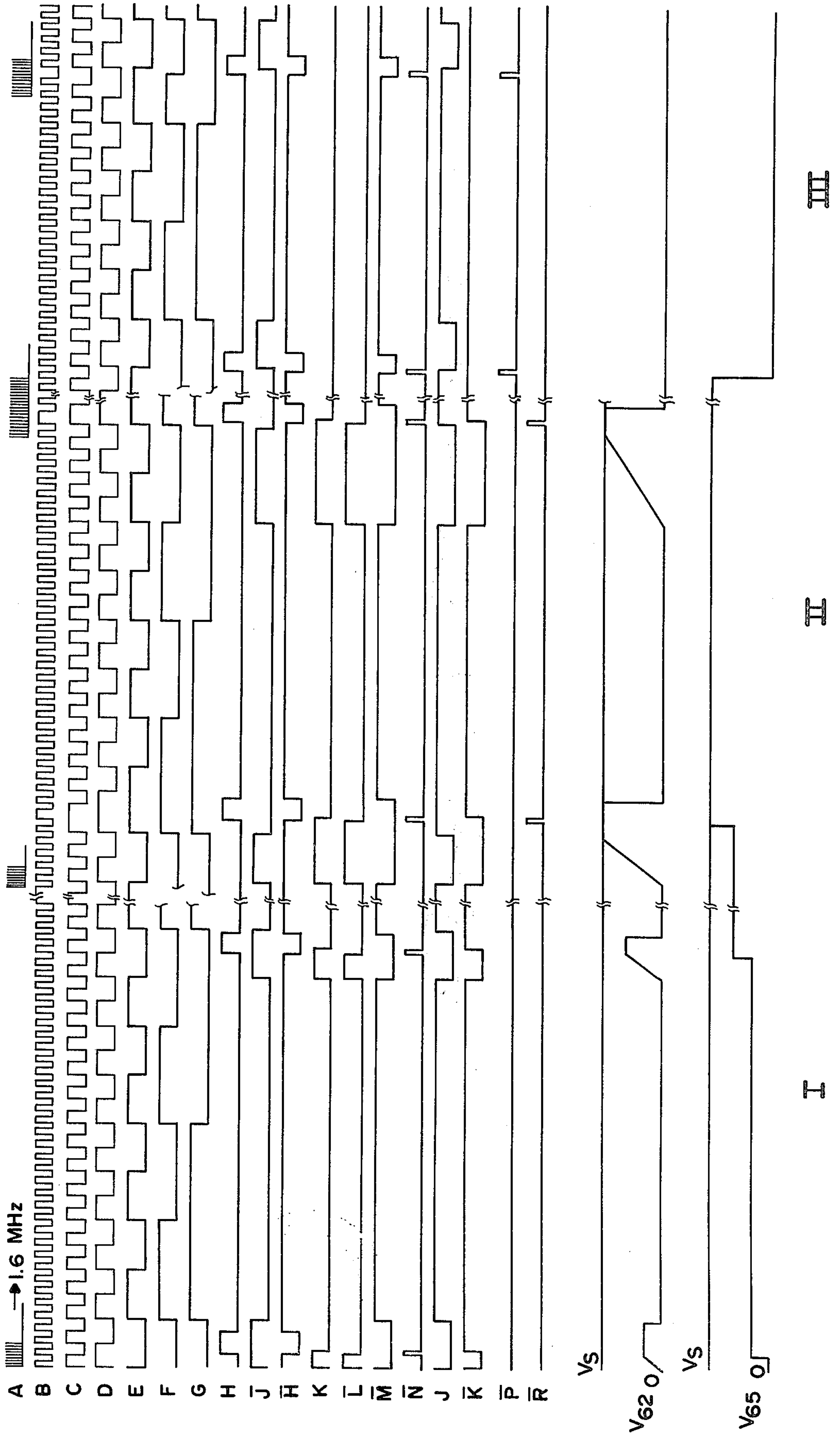
FIG. 2 is a timing diagram illustrating the relative times of the various signals present in the comparator of FIG. 1 and illustrating different phases between input signals to the comparator of FIG. 1.

In the operation of the frequency/phase comparator, the variable frequency pulses in the H wave form are compared to the frequency of the pulses in the $\overline{J}$ wave form. Referring to FIG. 2, it can be seen that the width of the pulses in the H wave form is slightly less than one-half the width of the pulses in the $\overline{J}$ wave form. Whenever the pulses in the H wave form appear within the same time slot as the pulses in the $\overline{J}$ wave form (in the present embodiment $\pi/4$ Radians of the reference frequency) the comparator circuit operates in the phase comparison mode. For operation of the comparator circuit in the phase comparison mode refer specifically to portion I of the timing diagram in FIG. 2.

In the phase comparison mode a $\overline{J}$ pulse appears at the input of flip-flop 31 first so that the K wave form goes high and the $\overline{K}$ wave form drops. Since the $\overline{H}$ wave form is still high, the output of the coincidence circuit 29 drops to a low which is inverted to a high by the inverter 40. This high is applied to the control terminal of gating means 60 to operate the gate so that capacitor 62 begins to charge toward the amplitude of supply voltage $V_S$ (see wave form $V_{62}$ FIG. 2). When the H pulse appears at terminal 21 the $\overline{H}$ pulse drops to a low and the output of the coincidence circuit 29 goes high, which change is inverted by inverter 40 and applied to gating means 60 to stop charging of capacitor 62. The appearance of the negative going $\overline{H}$ pulse also causes flip-flop 31 to change states and the K wave form drops to a low while the $\overline{K}$ wave form goes high. Simultaneously, the appearance of the positive going pulse in the H wave form produces a short negative pulse at the output of the coincidence circuit 26, which appears as a short positive pulse at the control terminal of the gating means 63, subsequent to the opening of gating means 60 (subsequent to the positive going pulse in the $\overline{L}$ wave form). The short positive going pulse in the $\overline{N}$ wave form closes gating means 63 to allow a sample of the voltage stored in capacitor 62 to be transferred to capacitor 65 and output terminal 64. This sample or transfer is illustrated in wave form $V_{65}$ in FIG. 2. It should be noted that a voltage generally midway between zero and $V_S$ is available at the output terminal 64 when the frequencies of the reference signal at terminal 10 and the variable frequency signal at terminal 21 are in phase.

Since both the $\overline{H}$ and $\overline{K}$ wave forms applied to coincidence circuit 30 have negative going pulses, the inverted ouput of the coincidence circuit 30 ($\overline{M}$) is low as long as pulses are applied to either of the inputs of the coincidence circuit 30. Thus, subsequent to the appearance of a J pulse at the output of the coincidence circuit 17 and an H pulse at the terminal 21 the $\overline{M}$ wave form rises to a high and gating means 70 closes to discharge capacitor 62. When the next pulse appears at either terminal 21 or the output of coincidence circuit 17, the M wave form drops to a low and gating means 70 opens so that capacitor 62 is ready for the next cycle. Thus, it should be noted that the sample of the voltage stored in capacitor 62, which appears at the output 64, is only taken subsequent to the charging of the capacitor 62 and is therefore a sample of a fixed DC voltage and, since a fixed DC voltage is being sampled noise, spikes and the like caused by sampling techniques of the prior art are eliminated.

When the leading edge of the H pulse appears subsequent to the trailing edge of the $\overline{J}$ pulse, both inputs to the coincidence circuit 29 are positive for the entire duration of the K pulse and, consequently, the gating means 60 is closed sufficiently long to allow capacitor 62 to charge to the amplitude of the supply voltage. Thus, the output at terminal 64 is a maximum as illustrated in wave form $V_{65}$. Simultaneously, wave form K, J and $\overline{N}$ are all high for a short period of time providing a short pulse in the R wave form applied to the set terminals of flip-flops 11, 12, 13, 15 and 16 and through NOR circuit 51 and inverter 54 to the flip-flop 14. Setting all of the flip-flops 11–16 at this time causes the next pulse in the J wave form to appear at a time when the next H pulse will be in approximately the correct phase, if the H wave form has the correct frequency. In the present embodiment for example, the correct frequency of the $\overline{J}$ and H pulses is 25 KHz and, consequently, the distance between leading edges of H pulses or $\overline{J}$ pulses should be 40 $\mu$ Sec. Because the $\overline{R}$ pulse occurs at the beginning of an H pulse, the flip-flops 11–16 are all set by the $\overline{R}$ pulse to cause the leading edge of the next $\overline{J}$ pulse to appear 35 $\mu$ Sec subsequent to the leading edge of the H pulse. Thus, if the leading edge of the next H pulse appears at approximately 40 $\mu$ Sec it will be approximately in the correct phase with the $\overline{J}$ pulse and it will be at approximately 25 KHz. By adjusting the phase of the reference pulses in this manner the comparator cannot lock onto a harmonic.

When the leading edge of the H pulse occurs before the leading edge of the $\overline{J}$ pulse (refer to portion III of FIG. 2) it is an indication that the frequency of the H wave form has increased. Since the $\overline{H}$ pulse causes the flip-flop 31 to change states the coincidence circuit 29 does not provide a pulse ($\overline{L}$) and the gating means 60 is not actuated. Thus, the charge on capacitor 62 remains at zero and this zero voltage is sampled when gating means 63 operates. It should be understood that a zero voltage at the output is the maximum voltage produced by the comparator circuit for use in decreasing the frequency of the variable frequency wave form H. Further, it should be noted that the $\overline{N}$ pulse, the J pulse and the $\overline{K}$ pulse applied to the coincidence circuit 34 produce a pulse in the $\overline{P}$ wave form causing flip-flops 11, 12, 13, 15 and 16 to be reset and flip-flop 14 to be set. This resetting and setting of the various flip-flops 11–16 causes the next J pulse to occur at a time when the next H pulse, if it is at the correct frequency, will be approximately in the correct phase. In the present embodiment setting flip-flop 14 and resetting the remaining flip-flops 11, 12, 13, 15 and 16 causes the leading edge of the next J pulse to appear 40 microseconds after the occurrence of the $\overline{P}$ pulse. Thus, if the next H and $\overline{J}$ pulses coincide the comparator is comparing the correct frequencies, rather than any harmonics.

Thus, an improved frequency/phase comparator is disclosed with a hold-sample-hold feature that improves the accuracy and reduces the noise output of the comparator. Further, in the event a capacitor is utilized as the voltage storage means the sensitivity of the comparator can be adjusted by adjusting the size of the capacitor. For example, when the size of capacitor 62 is reduced it will charge to the amplitude of the supply voltage quicker and, therefore, the faster charge time provides a higher voltage differential for a shorter period of time. That is, reducing the size of capacitor 62 will produce a higher output voltage for a smaller difference in phase between the H and J pulses. Further, the disclosed embodiment is easily incorporated into an integrated circuit and, because the comparator circuit can use CMOS components it will have a lower power consumption.

While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. A frequency/phase comparator comprising:

a. first input means for receiving a reference signal having a predetermined frequency;

b. second input means for receiving a variable frequency signal having a center frequency generally the same as the predetermined frequency;

c. logic circuitry connected to said first and second input means and providing first, second and third trains of pulses in response to the reference and variable frequency signals;

d. first, second and third gating means connected to said logic circuitry for operation in response to pulses in the first, second and third trains of pulses, respectively;

e. voltage storage means connected through said first gating means to voltage supply input means, said pulses in the first train each operating said first gating means to connect said voltage storage means to said voltage supply means for a period of time proportional to the amount the reference signal leads the variable frequency signal in phase;

f. said second gating means being connected to said voltage storage means and operating in response to the pulses in the second train to sample the amplitude of voltage stored in said voltage storage means; and g. said third gating means being connected to said voltage storage means and operating in response to the pulses in the third train to remove the voltage stored in the voltage storage means.

2. A frequency/phase comparator comprising:

a. logic circuitry having a first input for receiving reference pulses at a predetermined frequency and a second input for receiving variable frequency pulses with a center frequency generally the same as the predetermined frequency, said logic circuitry further having a first output providing pulses having a width proportional to the amount each reference pulse leads each variable frequency pulse in phase, a second output providing a pulse for each variable frequency pulse applied to the second input and a third output providing a pulse subsequent to each of the pulses at the second output;

b. voltage storage means;

c. first gating means having a control terminal coupled to the first output of said logic circuitry, an input terminal coupled to voltage supply input means and an output terminal coupled to said voltage storage means for allowing said voltage storage means to store a voltage having an amplitude proportional to the width of the pulses applied to the control terminal;

d. second gating means having a control terminal coupled to the second output of said logic circuitry, an input terminal coupled to said voltage storage means and an output terminal coupled to output means for supplying a sample of the voltage stored in said voltage storage means to said output means for each pulse applied to the control terminal of said second gating means; and e. third gating means having a control terminal coupled to the third output of said logic circuitry, an input terminal coupled to said voltage storage means and an output terminal coupled to a reference point for removing the voltage stored in said voltage storage means each time a pulse is applied to the control terminal of said third gating means.

3. A frequency/phase comparator as claimed in claim 2 wherein the voltage storage means includes a capacitor.

4. A frequency/phase comparator as claimed in claim 2 wherein each of the first, second and third gating means includes a semiconductor transmission gate.

5. A frequency/phase comparator as claimed in claim 2 wherein the output means includes a capacitor for storing sampled voltages.

6. A frequency/phase comparator as claimed in claim 2 wherein the logic circuitry includes a flip-flop having two inputs, connected to receive the reference pulses and the variable frequency pulses, respectively, and normal and inverted outputs and first and second coincidence circuits each having two inputs and an output, the inputs of said first coincidence circuit being coupled to receive the variable frequency pulses and the normal output of said flip-flop, respectively, and the output being coupled to the first output of said logic circuitry, and the inputs of said second coincidence circuit being coupled to receive the variable frequency pulses and the inverted output of said flip-flop, respectively, and the output being coupled to the third output of said logic circuitry.

7. A frequency/phase comparator as claimed in claim 2 including in addition a plurality of flip-flops connected to form a divider circuit for receiving a reference signal and providing the reference pulses.

8. A frequency/phase comparator as claimed in claim 7 including additional logic circuitry providing set and reset pulses to predetermined ones of the flip-flops in response to a reference pulse leading a variable frequency pulse and a reference pulse lagging a variable frequency pulse for adjusting the phase of the next reference pulse to force the next reference pulse to appear at approximately the correct time to coincide with the center frequency of the variable frequency pulses.

* * * * *